United States Patent [19]

Garibotto

[11] 4,277,834
[45] Jul. 7, 1981

[54] WAVE-SIGNAL-PROCESSING SYSTEM WITH A TWO-DIMENSIONAL RECURSIVE DIGITAL FILTER

[75] Inventor: Giovanni Garibotto, Turin, Italy

[73] Assignee: CSELT - Centro Studi e Laboratori Telecomunicazioni S.p.A., Turin, Italy

[21] Appl. No.: 55,262

[22] Filed: Jul. 6, 1979

Related U.S. Application Data

[63] Continuation-in-part of Ser. No. 968,863, Dec. 12, 1978, abandoned.

[30] Foreign Application Priority Data

Dec. 21, 1977 [IT] Italy .............................. 69862 A/77

[51] Int. Cl.³ ........................ G06F 15/31; G01V 1/28
[52] U.S. Cl. ..................................... 364/724; 367/43; 367/123
[58] Field of Search .................. 364/724; 367/37, 43, 367/48, 58, 99, 123

[56] References Cited

U.S. PATENT DOCUMENTS

| | | | |
|---|---|---|---|
| 3,161,851 | 12/1964 | Voglis et al. | 367/123 |
| 3,550,073 | 12/1970 | Foster et al. | 367/43 |
| 3,858,168 | 12/1974 | Barr, Jr. et al. | 367/43 |

*Primary Examiner*—Jerry Smith
*Attorney, Agent, or Firm*—Karl F. Ross

[57] ABSTRACT

A system for determining the location of a seismic wave source in a homogeneous medium (the soil) comprises a linear array of equispaced sensors sampled by respective pulse extractors in turn feeding a plurality of cascaded two-dimensional recursive digital filters which act as phase shifters estimating in small or incremental steps the magnitude of the wave field away from the sensor array. The output signals of the sensors are sampled at a rate equal to the ratio of the distance between the sensors and the wave velocity in the homogeneous medium, thereby giving rise to samples distributed in a single quadrant of the space-time domain. An attenuator connected in series with the phase-shifting filters damps frequency components outside the rotated quadrant, while an equalizer connected in cascade with the attenuator ensures a global linear response thereof. The location of the wave source is determined in the output of a filter-chain portion through a spike identifying the onset of wave generation and the sensor closest to the source; the source is located at a distance from the sensor array equal to the product of the number of filters in the chain portion producing the spike and the average magnitude of the incremental steps of distance at which the magnitude of the wave field is estimated by the filters.

7 Claims, 8 Drawing Figures

WAVE-SIGNAL-PROCESSING SYSTEM WITH A TWO-DIMENSIONAL RECURSIVE DIGITAL FILTER

CROSS-REFERENCE TO RELATED APPLICATION

This application is a continuation-in-part of my copending application Ser. No. 968,863 filed 12 Dec. 1978, now abandoned.

FIELD OF THE INVENTION

My present invention relates to a digital system for processing wave signals propagating through a homogeneous medium. More particularly, my invention relates to a digital system employing two-dimensional recursive filters for detecting actual or reflective sources of shock waves, such as seismic tremors, in a homogeneous medium such as the soil.

BACKGROUND OF THE INVENTION

Digital electronic systems for transmitting static or moving images or for processing acoustical recordings, radar echoes and seismic signals necessarily operate on signals defined in a two-dimensional domain, i.e. in time and space. Such signal-processing systems may include recursive filters, which considerably reduces the amount of computations while also providing a high application flexibility with respect to nonrecursive-filtering techniques. To augment processing efficiency, the pulse responses of the recursive filters are defined only in a half-plane of the space-time domain; the restriction of the pulse response does not preclude filter operation according to any specified frequency-response function. Although recursive filtering in a half-plane of the space-time domain is theoretically possible, conventional two-dimensional filters obtain good approximations only in a quadrant of the domain area. In the processing of images, constraining the signal response to a single quadrant achieves acceptable noise reduction or image restoration, but this technique is not suitable for the study of wave propagation through a homogeneous medium: a wavefront generated by a source in such a medium produces in a linear array of sensors a response defined by a hyperbola of the space-time domain, while a recursive filter with a pulse response defined only in a single quadrant is generally incapable of processing hyperbolically arrayed input data. In lieu of two-dimensional recursive filters effective in a half-plane, separate filtering has been proposed wherein the time variable is filtered recursively and the space variable is processed in a transversal filter. Such separate processing is likely to approximate the hyperbolic pulse response with a parabolic one, the symmetry of the response being preserved and times being roughly equivalent to those obtained with a two-dimensional recursive filter of like order. However, the simplification inherent in a parabolic approximation is too drastic to produce reliable results even by filters of a very high order.

OBJECT OF THE INVENTION

The object of my present invention is to provide a reliable system for pinpointing, with good accuracy, the location of a source of shock waves such as the epicenter of a seismic tremor.

SUMMARY OF THE INVENTION

A processing system for determining the location of a shock-wave source in a homogeneous medium comprises, according to my present invention, a multiplicity of equispaced sensors disposed in a generally linear array for detecting magnitudes of a wave field generated by the source. Samplers operationally connected to the sensors extract pulses therefrom at successive sampling intervals equal to the quotient of the distance between consecutive sensors divided by the average wave velocity in the homogeneous medium. A two-dimensional phase-shifting filter connected to the samplers generates during each sampling interval, on the basis of sampling pulses extracted from the sensors, output signals approximating wave-field values at progressively increasing distances in depth from the sensor array. A two-dimensional attenuator at the output of the filter damps signals having a temporal frequency component less in magnitude than the product of an associated spatial frequency component times the aforementioned wave velocity, while a two-dimensional equalizer is linked to the attenuator for ensuring a global linear response thereof.

According to another feature of my present invention, a plurality of two-dimensional filters connected in cascade for estimating field values in incremental steps from the sensor array together approximate wave-field values at a distance from the sensor array equal to the sum of the incremental steps.

According to another feature of my invention, the filters are of the recursive digital type with multipliers and adders interconnected for implementing the following relations:

$$f_r(p,q) = v(p - M, q) + \sum_{\substack{i=0 \\ i+k \neq 0}}^{M} \sum_{k=0}^{M} a_{i,k} V\left(p - M + \frac{i+k}{2}, q - \frac{k-i}{2}\right) \quad (1a)$$

$$v(p,q) = \underset{r-1}{f(p,q)} - \sum_{\substack{i=0 \\ i+k \neq 0}}^{M} \sum_{k=0}^{M} a_{i,k} v\left(p - \frac{i+k}{2}, q - \frac{k-i}{2}\right) \quad (1b)$$

where p and q are integers respectively specifying the sampling intervals and identifying the sensors, functions $$\underset{r-1}{f(p,q)}$$

and $f_r(p,q)$ are input and output signals of any given filter, upper summation limit M represents the order of the respective filter, function $v(p,q)$ is an intermediate processing signal generated by the respective filter in the $p^{th}$ sampling interval for the $q^{th}$ sensor, and real numbers $a_{i,k}$ are multiplication coefficients of the respective filter and satisfy the conditions $a_{i,k} = a_{k,i}$, $a_{i,k} = 0$ for $i+k$ odd, and $a_{0,0} = 1$.

According to yet another feature of my present invention, the attenuator and the equalizer are two-dimensional recursive filters, the attenuator including multipliers and adders for implementing the following relations:

$$g'(p,q) = \sum_{i=0}^{N} \sum_{k=0}^{N} b_{i,k} \, v' \left( p - \frac{i+k}{2}, q - \frac{k-i}{2} \right) \quad (2a)$$

$$v'(p,q) = g(p,q) - \sum_{\substack{i=0 \\ i+k \neq 0}}^{N} \sum_{k=0}^{N} c_{i,k} \, v' \left( p - \frac{i+k}{2}, q - \frac{k-i}{2} \right) \quad (2b)$$

where time and space coordinates p and q have the same significance as above, functions g(p,q) and g'(p,q) are input and output signals of the attenuator, upper summation limit N represents the order of the attenuator, function v'(p,q) is an intermediate processing signal generated by the attenuator in the $p^{th}$ sampling interval and associated with the $q^{th}$ sensor, and real numbers $b_{i,k}$, $c_{i,k}$ are multiplicative coefficients satisfying the conditions $b_{i,k}=b_{k,i}$, $c_{i,k}=c_{k,i}$, $b_{i,k}=c_{i,k}=0$ for i+k odd, and $c_{0,0}=1$.

Pursuant to another feature of my present invention, each filter includes a read/write memory storing, during each sampling interval and for assignment to a respective sensor, an intermediate signal generated during such sampling interval and M additional intermediate signals generated during M immediately preceding sampling intervals. The read/write memory also includes positions for storing initial and boundary data utilized in processing signals received during an initial sampling interval and signals assigned to peripherally disposed sensors. The adders and multipliers in each filter are connected to the read/write memory for receiving therefrom, during each sampling interval, intermediate signals generated during the M preceding sampling intervals and assigned to a respective sensor and intermediate signals generated during the preceding sampling interval and assigned to sensors adjacent this respective sensor.

BRIEF DESCRIPTION OF THE DRAWING

These and other features of my present invention will now be described in detail, reference being made to the accompanying drawing in which.

SPECIFIC DESCRIPTION

Figure 1A:
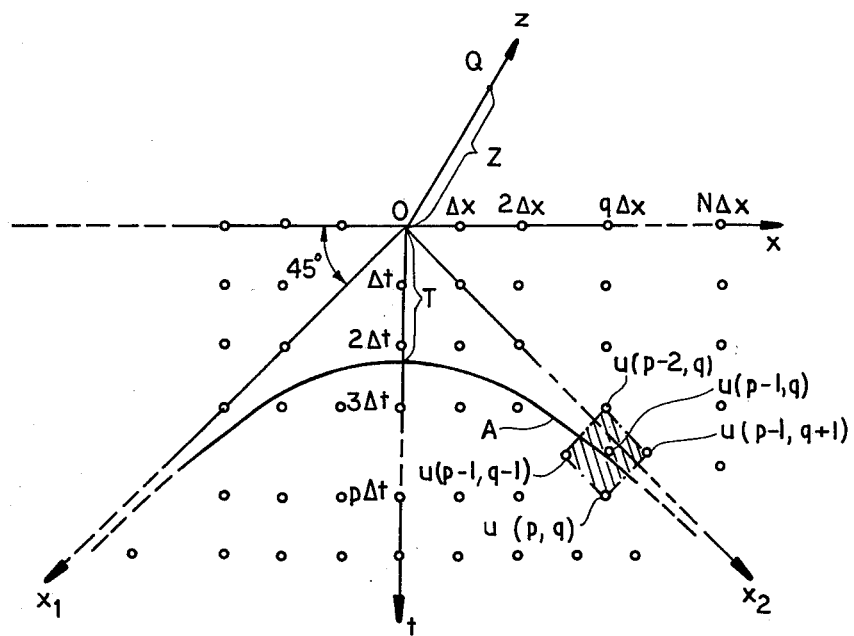
FIG. 1A is a graph of a space-time domain of wave samples processed by a filter system according to my present invention.

According to my present invention, a multiplicity of sensors $SE_1$, $SE_2$, ... $SE_n$ (FIG. 2) are separated by identical distances Δx along a line. As illustrated in FIG. 1A, a pulse u(p,q) extracted from a sensor $SE_q$ (q=1,2,..n) at time p Δt (p=0,1,2,..), where factor Δt is a constant sampling interval, is a function of a point (p,q) in a domain (t,x) having temporal and spatial coordinate axes t and x. A wavefront generated by a shock-wave source Q at a distance Z from sensor array $SE_1$-$SE_n$ (measured in a direction z transverse to line x) will give rise in the sensors to finite wave amplitudes located along a hyperbola A in the time-space domain (t, x), this hyperbola intersecting the t axis at a time coordinate T equal to the distance Z divided by an average wave velocity c in the medium between source Q and linear array $SE_1$-$SE_n$. This medium, which in the case of a seismic wave will be the soil, is considered for present purposes to be substantially homogeneous. As described in detail hereinafter, a second-order filtering device according to my present invention estimates, at a time pΔt for a point (q,z) spaced a distance z from sensor $SE_q$, a wave-field value u(p,q,z) at least partially in response to pulses u(p,q), u(p−1,q), u(p−2,q) extracted from sensor $SE_q$ at times pΔt, (p−1)Δt, (p−2)Δt and in response to pulses u(p−1,q−1), u(p−1,q+1) extracted from sensors $SE_{q-1}$, $SE_{q+1}$ at time (p−1)Δt. A fourth-order filtering device according to my invention would operate on pulses extracted from a respective sensor $SE_q$ during a $p^{th}$ sampling interval and the four preceding sampling intervals and on pulses extracted from adjacent sensors $SE_{q-1}$, $SE_{q+1}$ during the three preceding sampling intervals (p−1,p−2,p−3) and on pulses extracted from two further sensors $SE_{q-2}$, $SE_{q+2}$ during the second interval (p−2) before the $p^{th}$ interval.

Pulses u(p,q) are extracted from sensors $SE_1$-$SE_n$ by respective samplers or signal-level extractors $CA_1$, $CA_2$, ... $CA_n$ at intervals Δt=Δx/c. Such a sampling interval orients the asymptotes $x_1$, $x_2$ of hyperbola A in the t,x plane at a 45° angle with respect to coordinate axes t,x, as shown in FIG. 1A. Asymptotes $x_1$, $x_2$ may be regarded as a second spatial coordinate system ($x_1$, $x_2$) related to the time/space domain (t,x) by a linear transformation, as described more fully hereinafter.

Figure 1B:
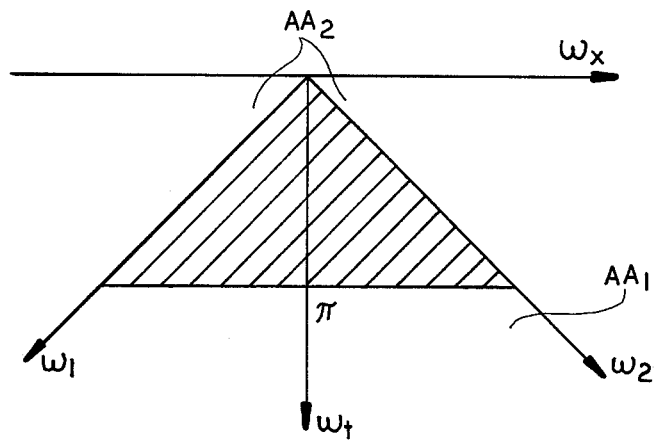
FIG. 1B is a graph of a frequency domain of samples occurring in the space-time domain of FIG. 1A.
Figure 2:
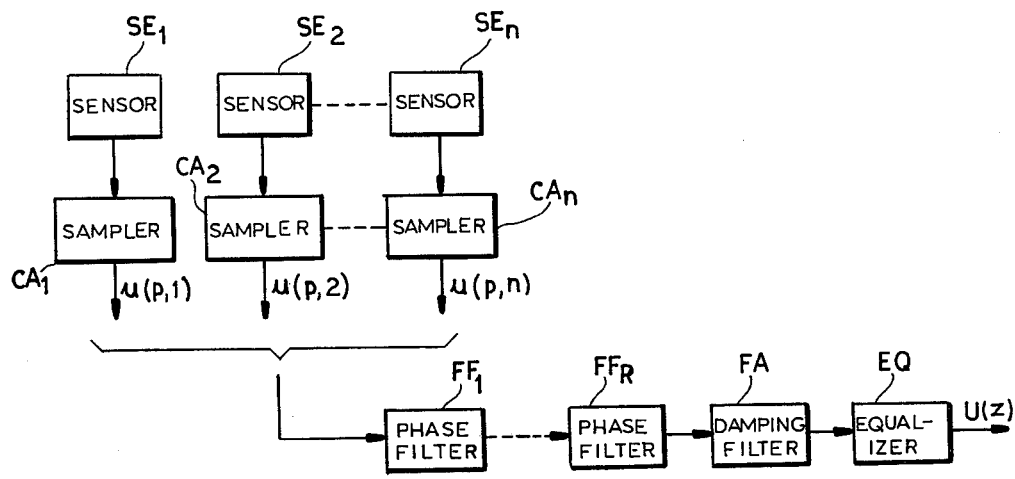
FIG. 2 is a block diagram showing a processing system according to my present invention.

In FIG. 1B I have shown two pairs of coordinate axes $\omega_t$, $\omega_x$ and $\omega_1$, $\omega_2$ defining two overlapping quadrants interrelated by a linear transformation and derived from quadrants (t,x) and ($x_1$,$x_2$) by respective Fourier transforms. As illustrated in FIG. 2, a system according to my present invention for determining the distance Z of shock-wave source Q from sensor array $SE_1$-$SE_n$ comprises a plurality of filters $FF_1$, $FF_2$, ... $FF_R$ serving as phase shifters for frequencies in an area $AA_1$ bounded by axes $\omega_1$, $\omega_2$ (FIG. 1B) and an attenuator filter FA which damps signals constituted by frequency pairs in adjoining octants forming an area $AA_2$. Areas $AA_1$ and $AA_2$ are respectively defined by $|\omega_t|>c|\omega_x|$ and $|\omega_t|\leq c|\omega_x|$.

Extractors $CA_1$, $CA_2$, ... $CA_n$ transmit at intervals pΔt staggered pulses u(p,1), u(p,2), ... u(p,n) from respective sensors $SE_1$, $SE_2$, ... $SE_n$ to the cascaded filters $FF_1$-$FF_R$, sensors $SE_1$-$SE_n$ being adapted to detect acoustic waves propagating through the intervening medium from shock-wave source Q. Filters $FF_1$-$FF_R$ are of the two-dimensional recursive digital type and have respective outputs successively approximating the wave field at progressively increasing distances from sensor array $SE_1$-$SE_n$, as more fully described hereinafter. Filter $FF_R$ works into attenuator filter FA which is in turn linked to an equalizer filter EQ for ensuring a linear phase response thereof.

Figure 3:
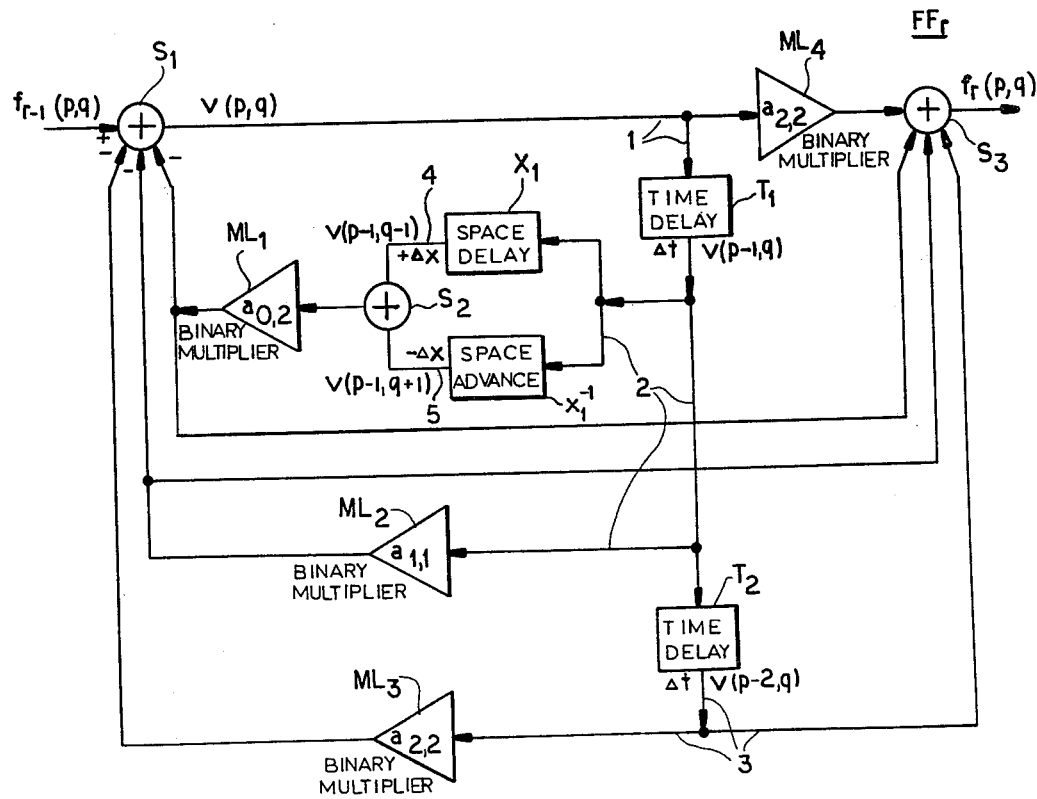
FIG. 3 is a block diagram of a second-order pulse filter shown in FIG. 2.

As shown in FIG. 3, a generic filter $FF_r$ (r=1,2, ..R) includes a digital adder $S_1$ which emits on a lead 1, during the $p^{th}$ processing interval, a signal v(p,q) associated with sensor $SE_q$. Signal v(p,q) is a spike fed to a binary multiplier $ML_4$ for multiplication with a coefficient $a_{2,2}$ and subsequent transmission to a digital adder $S_3$; in addition to feeding the unit $ML_4$, lead 1 supplies a time-delay unit $T_1$ whose output lead 2 extends to a space-delay unit $X_1$, to a space-advance unit $X_1^{-1}$, to a binary multiplier $ML_2$ and to another time-delay unit $T_2$. During the $p^{th}$ processing interval, lead 2 carries a pulse signal $v(p-1,q)$ present on lead 1 during the $(p-1)^{th}$ interval and delayed by a time $\Delta t$ in unit $T_1$. Upon receiving pulse $v(p-1,q)$, space-delay unit $X_1$ emits on a lead 4, extending to a digital adder $S_2$, a pulse $v(p-1)$ carried by lead 1 during the $(p-1)^{th}$ processing interval and associated with the $(q-1)^{th}$ sensor $SE_{q-1}$. It is to be noted that, during the $p^{th}$ processing interval $(p=0,1,2,..)$ for each sensor $SE_q(q=1,2,..n)$, filter $FF_r$ processes an input signal $f_{r-1}(p,q)$ to generate an output signal $f_r(p,q)$, pulse $v(p,q)$ constituting an intermediate product. Thus, pulse $v(p-1,q-1)$ is an intermediate signal in the processing of the output of the $(q-1)^{th}$ sensor $SE_{q-1}$.

During the $p^{th}$ processing interval, space-advance unit $X_1^{-1}$ receives pulse $v(p-1,q)$ and transmits to adder $S_2$ over a lead 5 a pulse $v(p-1,q+1)$ whose magnitude is derived, at least in part, from the signal level extracted from sensor $SE_{q+1}$, i.e. from a sensor adjacent sensor $SE_q$ in the array $SE_1$-$SE_n$, during the $(p-1)^{th}$ processing interval. The sum of signals $v(p-1,q-1)$ and $v(p-1,q+1)$ is transmitted from adder $S_2$ to a binary multiplier $ML_1$ for multiplication by a coefficient $a_{0,2}$. Pulse $v(p-1,q)$ is delayed by a time $\Delta t$ in unit $T_2$; this unit emits on a lead 3, working into adder $S_3$ and a binary multiplier $ML_3$, a pulse $v(p-2,q)$ present on lead 1 two processing intervals prior to the $p^{th}$ interval. Transmitted to adder $S_1$ from multipliers $ML_1$, $ML_2$, $ML_3$ are, respectively, the product of coefficient $a_{0,2}$ times the sum of pulses $v(p-1,q-1)$, $v(p-1,q+1)$, the product of a coefficient $a_{1,1}$ times pulse $v(p-1,q)$, and the product of a coefficient $a_{2,2}$ times pulse $v(p-2,q)$. Adder $S_1$ subtracts the outputs of units $ML_1$, $ML_2$, $ML_3$ from filter input signal $f_{r-1}(p,q)$, thereby generating the processing intermediate $v(p,q)$. The output signals of multipliers $ML_1$, $ML_2$, $ML_3$ are also transmitted to adder $S_3$ for summation with the product of coefficient $a_{2,2}$ times pulse $v(p,q)$ to produce filter output signal $f_r(p,q)$.

Figure 4:
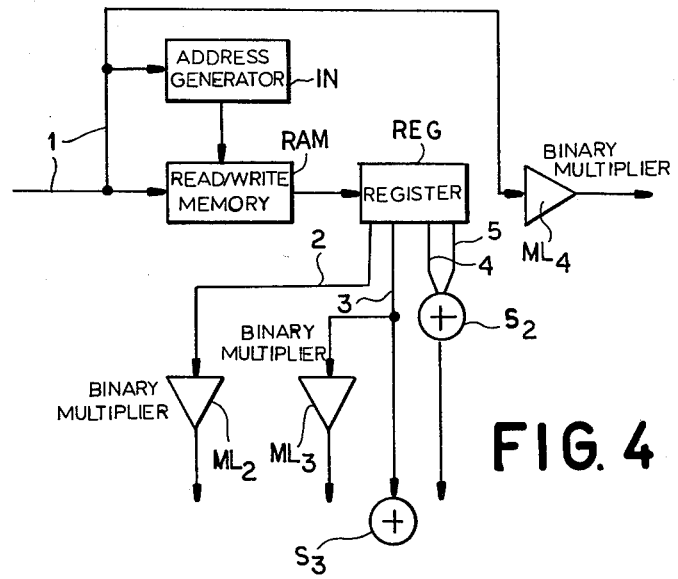
FIG. 4 is a block diagram of a portion of the filter shown in FIG. 3.

Time-delay units $T_1$ and $T_2$, space-delay unit $X_1$ and space-advance unit $X_1^{-1}$ may be realized by a read/write memory RAM, as illustrated in FIG. 4. In addition to being tied to multiplier $ML_4$, lead 1 works into memory RAM and into an address generator IN controlling the reading of the contents of that memory to a static register REG. Leads 2, 3 and 4,5 extend from register REG to multiplier $ML_2$, to multiplier $ML_3$ and adder $S_3$, and to adder $S_2$, respectively. Memory RAM includes a two-dimensional storage array having M rows and n columns, where M is the order of filter $FF_r$ and n is the number of sensors $SE_1$-$SE_n$; it also includes M storage positions for recording initial conditions of the system necessary for processing points on the contour of the discrete time-space domain $(p,q)$, $p=0,1,2..$, $q=1,2..n$. Because the filter shown in FIG. 3 is of the second order, memory RAM has two rows.

Upon the completion of the $p^{th}$ processing cycle, i.e. at the end of the $p^{th}$ sampling interval, memory RAM has stored all the intermediate signals $v(p,q)$ generated during this cycle, together with all the signals $v(p-1,q)$ generated during the preceding or $(p-1)^{th}$ cycle. Thus, at the onset of the $p^{th}$ cycle, signals $v(p-1,q)$ and $v(p-2,q)$ are stored in memory RAM for all the sensors $SE_q$, $q=1,2,..n$. Upon the transmission of a pulse $f_r(p,q)$ to adder $S_1$, a signal on lead 1 induces address generator IN to read from memory RAM to register REG the signals $v(p-1,q)$, $v(p-2,q)$, $v(p-1,q-1)$, $v(p-1,q+1)$ which are then emitted on leads 2, 3, 4, 5, respectively. Signal $v(p,q)$ is thereupon entered in memory RAM in the position theretofore occupied by signal $v(p-2,q)$. Thus, in general, during the $p^{th}$ sampling interval an intermediate processing signal $v(p,q)$ is generated for the $q^{th}$ sensor $SE_q(q=1,2,..n)$ from the signals $v(p-1,q)$ and $v(p-2,q)$ derived during the preceding two cycles for the same sensor $SE_q$ and from the signals $v(p-1,q-1)$ and $v(p-1,q+1)$ produced during the preceding cycle for the two sensors $SE_{q-1}$ and $SE_{q+1}$ adjacent sensor $SE_q$ in the array $SE_1$-$SE_n$. If q equals 1 or n, $v(p-1,q-1)$ or $v(p-1,q+1)$ take on pre-established values stored in memory RAM as initial boundary conditions. It is to be noted that the functions carried out by address generator IN, memory RAM and register REG (FIG. 4) are precisely those performed by time-delay units $T_1$ and $T_2$, space-delay unit $X_1$ and space-advance unit $X_1^{-1}$ (FIG. 3).

Filter $FF_r$ implements the aforedescribed relationships:

$$f_r(p,q) = v(p-M,q) + \sum_{i=0}^{M}\sum_{k=0}^{M} a_{i,k} v\left(p - M + \frac{i+k}{2}, q - \frac{k-i}{2}\right) \quad (1a)$$

$$v(p,q) = f_{r-1}(p,q) - \sum_{i=0}^{M}\sum_{k=0}^{M} a_{i,k} v\left(p - \frac{i+k}{2}, q - \frac{k-i}{2}\right) \quad (1b)$$

where M=2 is the order of the filter, with $a_{i,k}=a_{k,i}$ and with $a_{i,k}=0$ if $i+k$ is odd or zero. The process of deriving coefficients $a_{i,k}$ is described hereinafter with reference to FIGS. 1A, 1B and 2.

Figure 5:
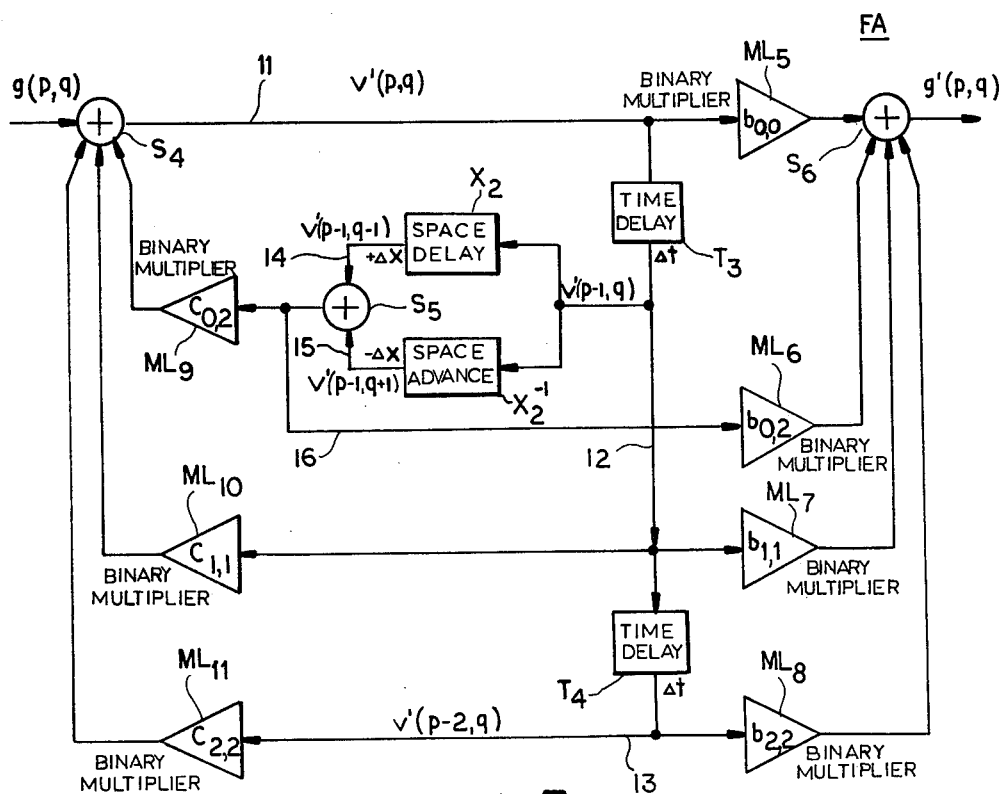
FIG. 5 is a block diagram of a damping filter shown in FIG. 2.

As illustrated in FIG. 5, attenuator FA comprises three adders $S_4$, $S_5$, $S_6$, two time-delay units $T_3$ and $T_4$, seven binary multipliers $ML_5$, $ML_6$, $ML_7$, $ML_8$, $ML_9$, $ML_{10}$, $ML_{11}$, a space-delay unit $X_2$ and a space-advance unit $X_2^{-1}$. Adder $S_4$ generates on a lead 11 an intermediate processing signal $v'(p,q)$ from pulses emitted by multipliers $ML_9$-$ML_{11}$ and from an attenuator input signal $g(p,q)$ identical with an output signal $f_R(p,q)$ of filter $FF_R$. Signal $V'(p,q)$ is transmitted to multiplier $ML_5$ for forming a product with a coefficient $b_{0,0}$, this product being fed to adder $S_6$. Besides being connected to multiplier $ML_5$, lead 11 extends to unit $T_3$ where signal $v'(p,q)$ is delayed by a time $\Delta t$. Upon receiving signal $v'(p,q)$, delay unit $T_3$ emits on a lead 12 a pulse $v'(p-1,q)$ which was carried by lead 11 during the preceding $(p-1)^{th}$ processing cycle. Lead 12 conducts pulse $v'(p-1,q)$ to multipliers $ML_7$ and $ML_{10}$, to time-delay unit $T_4$, to space-delay unit $X_2$ and to space-advance unit $X_2^{-1}$. Upon receiving pulse $v'(p-1,q)$, unit $T_4$ generates on a lead 13, working into multipliers $ML_8$ and $ML_{11}$, a signal $v'(p-2,q)$ transmitted on lead 11 during the $(p-2)^{th}$ processing cycle and delayed by a combined time $2\Delta t$ in units $T_3$, $T_4$. Pulses $v'(p-1,q-1)$ and $v'(p-1,q+1)$ are fed via leads 14 and 15 to adder $S_5$ by space-delay unit $X_2$ and space-advance unit $X_2^{-1}$, respectively, upon the reception thereby of pulse $v'(p-1,q)$. Pulses $v'(p-1,q-1)$ and $v'(p-1,q+1)$ represent intermediate products in the processing of sampler output signals $u(p-1,q-1)$ and $u(p-1,q+1)$; adder $S_5$ sums pulses $v'(p-1,q-1)$ and $v'(p-1,q+1)$ and feeds the results to multipliers $ML_6$ and $ML_9$ over a lead 16. Multipliers $ML_9$, $ML_{10}$ and $ML_{11}$ form the products of a coefficient $c_{0,2}$ times pulse sum $v'(p-1,q-1)+v'(p-1,q+1)$, of a coefficient $c_{1,1}$ times pulse $v'(p-1,q)$, and of a coefficient $c_{2,2}$ times signal $v'(p-2,q)$, respectively, and transmit these products to adder $S_4$ for summation with signal $g(p,q)$ to produce signal $v'(p,q)$. The sum $v'(p-1,q-1)+v'(p-1,q+1)$ emitted by adder $S_5$ on lead 16 is multiplied in unit $ML_6$ by a weighting coefficient $b_{0,2}$ and then transmitted to adder $S_6$. Units $ML_7$ and $ML_8$ multiply pulses $v'(p-1,q)$ and $v'(p-2,q)$ by weighting coefficients $b_{1,1}$ and $b_{2,2}$ and feed the resulting products to adder $S_6$. This adder sums the output signals of multipliers $ML_5$-$ML_8$ to form the signal $g'(p,q)$ which is transmitted to equalizer EQ. The latter may be a two-dimensional recursive digital filter having the structure shown in FIG. 3.

Attenuator FA may be designed as a read/write memory, as heretofore described with reference to FIG. 4, and implements the following relationships:

$$g'(p,q) = \sum_{i=0}^{N} \sum_{k=0}^{N} b_{i,k} v'\left(p - \frac{i+k}{2}, q - \frac{k-i}{2}\right) \quad (2a)$$

$$v'(p,q) = g(p,q) - \sum_{i=0}^{N} \sum_{k=0}^{N} c_{i,k} v'\left(p - \frac{i+k}{2}, q - \frac{k-i}{2}\right) \quad (2b)$$

where $b_{i,k} = c_{i,k} = 0$ if $i+k$ is odd or zero and where $b_{i,k} = b_{k,i}$ and $c_{i,k} = c_{k,i}$. The method of determining coefficients $b_{i,k}$, $C_{i,k}$ is described hereinafter with reference to FIGS. 1A, 1B and 2.

Under the aforementioned assumption that the space between source Q (FIG. 1A) and sensor array $SE_1$-$SE_n$ is occupied by a homogeneous medium characterized by an average acoustical velocity c, and with disregard of multiple reflections in the medium, a pulse or wave packet generated by source Q at a distance Z from linear array $SE_1$-$SE_n$ creates a wavefront whose arrival at array $SE_1$-$SE_n$ is plotted along hyperbola A in the space-time domain (t,x) whose spatial dimension x and temporal dimenson t are discretized according to intersensor distance $\Delta x$ and sampling interval $\Delta t$, respectively, as shown in FIG. 1A. Furthermore, because the problems of studying a wave field u(t,x,z) generated by source Q are reduced to linear ones under these assumptions, the principle of superposition may be applied, thereby allowing the utilization of the techniques of two-dimensional linear digital filtering, and particularly recursive filtering, to approximate the magnitude of the wave field u(t,x,z) at predetermined distances from the sensor array, $SE_1$-$SE_n$.

Wave field u(t,x,z) satisfies the equation for a two-dimensional hyperbolic wave:

$$c^2\left(\frac{\partial^2 u}{\partial x^2} + \frac{\partial^2 u}{\partial z^2}\right) = \frac{\partial^2 u}{\partial t^2} \quad (3)$$

where variations along a third dimension y of Cartesian space (x,y,z) are neglected. The wave equation (3) may also be written in the form:

$$\frac{\partial^2 U(\omega_t, \omega_x, z)}{\partial z^2} = -\left(\frac{\omega_t^2}{c^2} - \omega_x^2\right) \cdot U(\omega_t, \omega_x, z) \quad (4)$$

where function $U(\omega_t,\omega_x,z)$ is the two-dimensional Fourier transform, in variables x and t, of the wave field u(t,x,z):

$$U(\omega_t,\omega_x,z) = \int_{-\infty}^{+\infty}\int u(t,x,z)\exp[-j(\omega_x x + \omega_t t)]dx\,dt. \quad (5)$$

The general solution of equations (3) and (4) in the frequency domain $(\omega_t,\omega_x)$ of FIG. 1B with distance parameter z is:

$$U(\omega_t,\omega_x,z) = A_0 \exp\left(jz\sqrt{\frac{\omega_t^2}{c^2} - \omega_x^2}\right) + B_0 \exp\left(-jz\sqrt{\frac{\omega_t^2}{c^2} - \omega_x^2}\right). \quad (6)$$

Because waves traveling only in the negative direction of the z axis are to be considered (see FIG. 1A), coefficient $A_0$ is set equal to 0 and general solution (6) takes on the form:

$$U(\omega_t,\omega_x,z) = \begin{cases} U(\omega_t,\omega_x,O)\exp\left(-jz\sqrt{\frac{\omega_t^2}{c^2} - \omega_x^2}\right) & \text{for area } AA_1 \\ U(\omega_t,\omega_x,O)\exp\left(-z\sqrt{\omega_x^2 - \frac{\omega_t^2}{c^2}}\right) & \text{for area } AA_2 \end{cases} \quad (7)$$

where $U(\omega_t,\omega_x, 0)$ is the Fourier transform of u(t,x,0) which is the boundary condition for wave equation (3). Wave field u(t,x,z) may be obtained from function $U(\omega_t,\omega_x,z)$ by the inverse Fourier transform or by filtering the input data or boundary function u(t,x,0) with the processing system heretofore described with reference to FIGS. 2–5.

Let us define a frequency function $H_z(\omega_t,\omega_x)$ by the equation:

$$H_z(\omega_t,\omega_x) = \begin{cases} \exp\left(-jz\sqrt{\frac{\omega_t^2}{c^2} - \omega_x^2}\right) & \text{for area } AA_1 \\ \exp\left(-z\sqrt{\frac{\omega_t^2}{c^2} - \omega_x^2}\right) & \text{for area } AA_2. \end{cases} \quad (8)$$

Then a field value u(t,x,z) may be obtained from boundary or initial datum u(t,x,O) by convolving the same with a "migration" function $h_z(t,x)$:

$$u(t,x,z) = u(t,x,O) \cdot h_z(t,x) \quad (9)$$

where function $h_z(t,x)$ has dominant values along hyperbola A (FIG. 1A), has a predetermined spatial and termporal decay and is the inverse Fourier transform of frequency function $H_z(\omega_t,\omega_x)$. Equation (9) may be written:

$$u(t,x,z) = \frac{1}{\sqrt{2\pi}} \int_{-\infty}^{+\infty} \int_{-\infty}^{+\infty} u(\xi,\eta,0)h_z(-t-\xi,x-\eta)d\xi d\eta \quad (9a)$$

or approximated by a discrete sum:

$$u(p,q,z) = \frac{1}{\sqrt{2\pi}} \sum_\sigma \sum_\tau u(\sigma,\tau,0)h_z(p-\sigma,q-\tau) \quad (9b)$$

where $\tau = -\infty \ldots -3,-2,-1,0,1,2,3, \ldots +\infty$ and $\sigma = 0,1,2,3 \ldots \infty$. The wave-field value $u(p,q,z+\Delta z)$ at a point in the homogeneous propagation medium spaced by a distance $\Delta z$ from a point $(p,q,z)$ along a perpendicular to linear array $SE_1-SE_n$ may be obtained from field value $u(p,q,z)$ by the equation:

$$u(p,q,z+\Delta z) = \frac{1}{\sqrt{2\pi}} \sum_\sigma \sum_\tau u(\sigma,\tau,z)h_{\Delta z}(p-\sigma,q-\tau). \quad (9c)$$

Thus, field values at a distance $z+\Delta z$ may be estimated by summing field values $u(\sigma,\tau,z)$ of a plane parallel to plane t,x. For an $M^{th}$-order filter, equation (9c) may be rewritten in the form:

$$f_r(p,q) = a_{M,M}f_{r-1}(p,q) + \sum_{\substack{i=0 \\ i+k\neq 0 \neq 2M}}^{M}\sum_{k=0}^{M} a_{i,k}\left[v\left(p-M+\frac{i+k}{2},q-\frac{k-i}{2}\right) - a_{M,M}v\left(p-\frac{i+k}{2},q-\frac{k-i}{2}\right)\right] + v(p-M,q)[1-a_{M,M}^2] \quad (9d)$$

where $f_r(p,q) = u(p,q,z+\Delta z)$ and $f_{r-1}(p,q) = u(p,q,z)$. Equation (9d) is fully equivalent to equations (1a), (1b) and, for a second-order filter (FIG. 3), may be reduced to:

$$f_r(p,q) = a_{2,2}f_{r-1}(p,q) + \\ a_{0,2}(1-a_{2,2})[v(p-1,q-1) + v(p-1,q+1)] + \\ a_{1,1}(1-a_{2,2})v(p-1,q) + (1-a_{2,2}^2)v(p-2,q) \quad (9e)$$

where $f_r(p,q) = u(p,q,z+\Delta z)$ is the output of filter $FF_r$ during the $p^{th}$ processing interval for the $q^{th}$ sensor $SE_q$, $f_{r-1}(p,q) = u(p,q,z)$ is the output of filter $FF_{r-1}$ during the $p^{th}$ interval for the $q^{th}$ sensor $SE_q$, $v(p-1,q-1)$, $v(p-1,q)$, $v(p-1,q+1)$ and $v(p-2,q)$ are intermediate processing signals generated by the $r^{th}$ filter $FF_r$, as heretofore described with reference to FIGS. 3 and 4, and $a_{0,2}$, $a_{1,1}$ and $a_{2,2}$ are multiplier coefficients implemented by units $ML_1-ML_4$ (FIG. 3).

As heretofore described, field $u(t,x,z)$ may be obtained from function $U(\omega_t,\omega_x,z)$ by applying the inverse Fourier transform. To determine the values of function $U(\omega_t,\omega_x,z)$, a two-dimensional filter is needed whose phase and amplitude response is specified by frequency function $H_z(\omega_t,\omega_x)$ as per equation (8). Function $H_z(\omega_t,\omega_x)$ may be approximated within area $AA_1$ (FIG. 1B) by a phase-shifting filter $FF_r$ having the frequency response:

$$P_z(\omega_t,\omega_x) = \exp\left(-jz\sqrt{\frac{\omega_t^2}{c^2}-\omega_x^2}\right) \quad (10)$$

and within area $AA_2$ by an attenuator or fan-type filter FA with the frequency response:

$$|F_z(\omega_t,\omega_x)| = \exp\left(-z\sqrt{\omega_x^2-\frac{\omega_t^2}{c^2}}\right). \quad (11)$$

A filter with the frequency response defined by equations (10) and (11) has a pulse response maximized along hyperbola A (FIG. 1A) which is defined by the equation:

$$c^2t^2-x^2=Z^2. \quad (12)$$

Hyperbola A generally lies in a half-plane $t\geq 0$ and has asymptotes $t=\pm(x/c)$. However, no convenient methods are available for designing two-dimensional recursive digital filters satisfying a given phase specification in the frequency domain. According to my present invention, it is possible to limit the response of a 2-D recursive filter to a single quadrant by normalizing the sampling intervals $\Delta t$ and by rotating the coordinate axes t, x through a 45° angle. Variables t and x are transformed according to the equations:

$$t = \frac{\sqrt{2}}{2}(x_1+x_2)$$

$$x = \frac{\sqrt{2}}{2}(x_2-x_1) \quad (13)$$

while sampling interval $\Delta t$ is set equal to quotient $\Delta x/c$, as heretofore described with reference to FIG. 2. As illustrated in FIG. 1A, the new coordinate axes $x_1$, $x_2$ are superimposed upon the asymptotes of the hyperbola A whose equation (12) is transformed into:

$$2x_1x_2=z^2. \quad (14)$$

Thus, the pulse response is confined to the quadrant ($x_1\geq 0$ and $x_2\geq 0$) and conventional techniques can be used to design the 2-D recursive phase filter. The sampling interval $\Delta x_1 = \Delta x_2$ is proportional to the real-time sampling interval $\Delta t$ by the factor $$\frac{\sqrt{2}}{2} : \Delta x_1 = \frac{\sqrt{2}}{2}\Delta t.$$

Upon the transformation of coordinates t and x into coordinates $x_1$ and $x_2$, equation (8) is converted into the form:

$$H_z(\omega_1,\omega_2) = \quad (15)$$

$$\begin{cases} \exp(-jz\sqrt{2\omega_1\omega_2}) \text{ in area } AA_1 \text{ with } \omega_1 \geq 0 \text{ and } \omega_2 \geq 0 \\ \exp(-z\sqrt{-2\omega_1\omega_2}) \text{ in area } AA_2 \text{ with } \omega_1 < 0 \text{ and } \omega_2 < 0 \end{cases}$$

while equations (10) and (11) are transformed into:

$$P_z(\omega_1,\omega_2) = \exp(-jz\sqrt{2\omega_1\omega_2}) \tag{16}$$

and $$|F_z(\omega_1,\omega_2)| = \exp(-z\sqrt{-2\omega_1\omega_2}) \tag{17}$$

A phase-shifting $M^{th}$-order filter $FF_r$ having the frequency response specified by equation (16) must have a transfer function $D(y_1,y_2)$ in complex variables $y_1 = \exp(-j\omega_1)$ and $y_2 = \exp(-j\omega_2)$:

$$D(y_1,y_2) = \frac{(y_1)^M (y_2)^M A^{-1}(y_1,y_2)}{A(y_1,y_2)} \tag{18}$$

where $A^{-1}(y_1,y_2)$ and $A(y_1,y_2)$ are polynomials of the type:

$$A^{-1}(y_1,y_2) = \sum_{i=0}^{M}\sum_{k=0}^{M} a_{M-i,M-k} y_1^{i-M} y_2^{k-M} \tag{19}$$

and $$A(y_1,y_2) = \sum_{i=0}^{M}\sum_{k=0}^{M} a_{i,k} y_1^i y_2^k \tag{20}$$

In order that transfer function $D(y_1,y_2)$ optimally approximate frequency response $P_z(\omega_1,\omega_2)$, polynomial coefficients $a_{i,k}$ must satisfy the constraining equations:

$$a_{i,k} = a_{k,i} \text{ for } i=0,1,2,3,\ldots, k=0,1,2,3,\ldots \tag{21}$$

and $$a_{i,k} = 0 \text{ for } i+k \text{ odd} \tag{22}$$

Condition (21) ensures symmetry of filter response with respect to time variable t, while constraint (22) arises from the requirement that the filter coefficients match the rectangular sampling raster in the domain (x,t) of FIG. 1A after 45° rotation. Coefficients $a_{i,k}$ having particular numerical values determined by an iterative method described hereinafter are the same as the identically labeled coefficients of equations (9d) and (9e) and the weighting coefficients multiplied with intermediate signals v(p,q) by units $ML_1$ to $ML_4$ (FIG. 3). Sample values for coefficients $a_{i,k}$ are listed for a fourth-order filter in the following Table 1.

TABLE 1

| k i | 0 | 1 | 2 | 3 | 4 |
|---|---|---|---|---|---|
| 0 | 1 | 0 | 0.24104 | 0 | 0.11738 |
| 1 | 0 | −0.15228 | 0 | −0.096312 | 0 |
| 2 | 0.24104 | 0 | −0.044616 | 0 | −0.0057067 |
| 3 | 0 | −0.096312 | 0 | −0.050821 | 0 |
| 4 | 0.11738 | 0 | −0.0057067 | 0 | 0.0598 |

According to my present invention, attenuating filter FA (FIG. 2) has a frequency response $F_z(\omega_1,\omega_2)$—see equation (17)—approximated by a transfer function $K(y_1,y_2)$ in complex variables $y_1$, $y_2$:

$$K(y_1,y_2) = \frac{B(y_1,y_2)}{C(y_1,y_2)} \tag{23}$$

where $B(y_1,y_2)$ and $C(y_1,y_2)$ are polynomials having the forms:

$$B(y_1,y_2) = \sum_{i=0}^{M}\sum_{k=0}^{M} b_{i,k} y_1^i y_2^k \tag{24}$$

and $$C(y_1,y_2) = 1 + \sum_{\substack{i=0 \ k=0 \\ i+k \neq 0}}^{M}\sum^{M} c_{i,k} y_1^i y_2^k \tag{25}$$

Coefficients $b_{i,k}$ and $c_{i,k}$ are the multiplicative factors formed into products with intermediate signals v'(p,q) by units $ML_5$ to $ML_{11}$—see FIG. 5 and equation (2)—and satisfy symmetry conditions $b_{i,k}=b_{k,i}$, $c_{i,k}=c_{k,i}$ for $i=0,1,2,3,\ldots$ and $k=0,1,2,3,\ldots$ and constraints $b_{i,k}=0$, $c_{i,k}=0$ for $i+k$ odd. Sample values for coefficients $b_{i,k}$, $c_{i,k}$ are given for a fourth-order attenuator in the following Tables 2 and 3, respectively.

TABLE 2

| i \ k | 0 | 1 | 2 | 3 | 4 |
|---|---|---|---|---|---|
| 0 | 1 | 0 | −1.37690 | 0 | −0.23048 |
| 1 | 0 | −0.24622 | 0 | 3.24766 | 0 |
| 2 | −1.37690 | 0 | 7.17777 | 0 | −1.53323 |
| 3 | 0 | 3.24766 | 0 | −2.93119 | 0 |
| 4 | −0.23048 | 0 | −1.53323 | 0 | −0.96888 |

TABLE 3

| i \ k | 0 | 1 | 2 | 3 | 4 |
|---|---|---|---|---|---|
| 0 | 1 | 0 | −0.58040 | 0 | 0.027076 |
| 1 | 0 | 0.28080 | 0 | −0.098575 | 0 |
| 2 | −0.58040 | 0 | 0.38137 | 0 | −0.030208 |
| 3 | 0 | −0.098575 | 0 | 0.058745 | 0 |
| 4 | 0.027076 | 0 | −0.030208 | 0 | 0.011137 |

Thus, filters $FF_r$ (FIGS. 2 and 3) approximate function $P_z(\omega_1,\omega_2)$ in a shaded triangular area shown in FIG. 1B, this area being bounded by the positive halves of axes $\omega_1,\omega_2$ and by the line $\omega_t = \pi$. It is to be noted that parameters $\omega_1,\omega_2$ represent coordinate axes rotated by 45° from axes $\omega_t,\omega_x$ of the domain $(\omega_t,\omega_x, z)$ of Fourier-transform function $U(\omega_t,\omega_x, z)$:

$$U(\omega_t,\omega_x, z) = \sum_{p=0}^{P}\sum_{q=-Q}^{Q} u(p,q,z)\exp[-j(\omega_t p + \omega_x q)] \tag{26}$$

where upper limit P is the number of samples along time axis t (FIG. 1A) while 2Q+1 is equal to the number n of samples along the spatial dimension x. Wave numbers $f_x$ and wave frequencies $f_t$ detectable by the processing system of FIG. 2 range from zero to half the sensor density $f_{sx}$ and half the sampling rate $f_{st}$, respectively, where the sensor density $f_{sx}$ is the reciprocal of the intersensor interval $\Delta x$ and the sampling rate $f_{st}$ is the quotient of the seismic velocity c divided by distance $\Delta x$. Parameters $\omega_t,\omega_x$ are related to wave frequency $f_t$ and wave number $f_x$ by the equations:

$$\omega_t = \frac{2\pi f_t}{f_{st}} \tag{27a}$$

$$\omega_x = \frac{2\pi f_x}{f_{sx}} \quad (27b)$$

It is clear that the maximum detectable value of variables $\omega_t$ and $\omega_x$ is $\pi$; thus, the line $\omega_t = \pi$ is the lower limit of the shaded area in FIG. 1B which is the set of all parameter pairs $\omega_t$, $\omega_x$ or $\omega_1, \omega_2$ for which a response specified by equation (10) or (16) must be given by a filter $FF_r$ (r = 1,2,3, . . . R).

A method of designing a two-dimensional all-pass recursive filter $FF_r$ includes minimization of a mean squared error $J(a_{i,k})$. Let frequency-response function $P_z(\omega_1, \omega_2)$ of equation (16) be separated into real and imaginary parts and evaluated at fixed parameter $(\omega_{1m}, \omega_{2m})$:

$$P_z(\omega_{1m}, \omega_{2m}) = \cos\phi_m + j\sin\phi_m \quad (28)$$

where $\phi_m = -z\sqrt{2\omega_{1m}\omega_{2m}}$. Two-dimensional all-pass phase filter $FF_r$ (r = 1,2, . . . R) has a complex frequency response approximated by the transfer function $D(y_{1m}, y_{2m})$ at parameters $\omega_{1m}, \omega_{2m}$:

$$D(y_{1m}, y_{2m}) = D(\exp[-j\omega_{1m}], \exp[-j\omega_{2m}]) = \quad (29)$$
$$\exp\{-j[M(\omega_{1m} + \omega_{2m}) + 2 < A(y_{1m}, y_{2m})]\} =$$
$$\exp\{-j[M(\omega_{1m} + \omega_{2m}) + 2 < A(\exp[-j\omega_{1m}],$$
$$\exp[-j\omega_{2m}])]\} = \cos\theta_m + j\sin\theta_m$$

where $\theta_m = -M(\omega_{1m} + \omega_{2m}) + 2 < A(\exp[-j\omega_{1m}], \exp[-j\omega_{2m}])$.

Mean-squared-error function $J(a_{i,k})$ is formed from the square of the difference between equations (28) and (29), summed over the number m of predetermined parameter pairs $(\omega_{1m}, \omega_{2m})$:

$$J(a_{i,k}) = \sum_m \{P_z(\omega_{1m}, \omega_{2m}) - D(\exp[-j\omega_{1m}], \quad (30)$$
$$\exp[-j\omega_{2m}])\}^2 = \sum_m |\theta_m|^2 = 4 \sum_m \sin^2\left(\frac{\phi_m - <D_m}{2}\right)$$

As described by C. K. Sanathanan and H. Tsukai in a paper entitled "Synthesis of Transfer Function From Frequency-Response Data" (International Journal of System Science, Vol. 5, No. 4, pp. 41–54, 1974), this is a typical nonlinear problem which can be converted into linear form by using a weighted error function $J'(a_{i,k})$ in an iterative process:

$$J'(a_{i,k}) = \sum_m \left|(\epsilon_m) \frac{A_{m,l}}{A_{m,l-1}}\right|^2 \quad (31)$$

where $A_{m,l}$ represents the value at parameters $\omega_{1m}, \omega_{2m}$ of polynomial $A(\exp[-j\omega_{1m}], \exp[-j\omega_{2m}])$ whose coefficients are to be determined in the $l^{th}$ step of the iteration, complex number $A_{m,l-1}$ similarly representing the value at parameters $\omega_{1m}, \omega_{2m}$ of the polynomial $A(\exp[-j\omega_{1m}], \exp[-j\omega_{2m}])$ according to equation (20) whose coefficients have been determined at the $(l-1)^{th}$ step of the iteration. The condition necessary for error function $J(a_{i,k})$ to be minimized is satisfied by equating to zero the first-order partial derivatives of function $J'(a_{i,k})$ with respect to the unknown coefficients $a_{i,k}$ at each step $l$ of the iteration, which entails the solution of a linear system of equations:

$$[S_{s,w}]^{(l)} a^{(l)} = [\gamma_s]^{(l)} \quad (32)$$

where:

$$a^{(l)} = [a_{0,1}, a_{0,2} \ldots a_{1,0}, a_{1,1} \ldots a_{i,k} \ldots a_{M,0}, a_{M,1} \ldots a_{M,M}]^T \quad (33)$$

Matrix coefficients $S_{s,w}^{(l)}$ are easily evaluated:

$$S_{s,w}^{(l)} = \sum_m \{\cos[(i - \mu)\omega_{1m} + (k - \nu)\omega_{2m}] - \quad (34)$$
$$\cos\phi_m \cos[(M - i - \mu)\omega_{1m} + (M - k - \nu)\omega_{2m}] +$$
$$\sin\phi_m \sin[(M - i - \mu)\omega_{1m} + (M - k - \nu)\omega_{2m}]\} / |A_{m,l-1}|^2$$

where:

$$\begin{cases} s = \mu(M+1) + \nu \\ w = i(M+1) + k \end{cases} \begin{cases} \mu,\nu = 0,1 \ldots M \quad \mu + \nu \neq 0 \\ i,k = 0,1 \ldots M \quad i + k \neq 0 \end{cases} \quad (35)$$

and the constant term is given by:

$$\gamma_s^{(l)} = S_{s,0}^{(l)} \quad (36)$$

Sum (34) is carried out on the fixed set of parameter pairs $\omega_{1m}, \omega_{2m}$ in the approximation domain $AA_1$ (FIG. 1B). Frequency-response function $P_z(\omega_{1m}, \omega_{2m})$ of equation (28) must take into account the linear term due to the chosen order M of filter $FF_r$.

I have used the method of error minimization to design recursive digital filters with linear phase, as described in my paper "On 2-D Recursive Digital Filter Design with Complex Frequency Specifications," published in *Proceedings ICC 1977* (pages 9B-2-202 to 206, June 1977). It is to be noted that in designing all-pass filter $FF_r$ the coefficients $a_{i,k}$ chosen initially do not seriously affect the final approximation in the iteration. Convergence of the filter coefficients $a_{i,k}$ in the iteration corresponds to the minimization of the original unweighted error $J(a_{i,k})$ as per equation (30). Furthermore, stability must be tested at each step and a stabilization strategy developed in order to guarantee a meaningful result. Owing to the limited order of the chosen two-dimensional one-quadrant all-pass recursive digital filters, these problems can be overcome satisfactorily with techniques described by T. S. Huang in the paper "Stability of Two-Dimensional Recursive Filters" published in *IEEE Transactions on Audio Electroacoustics AU-20*, No. 2, pages 158–163, June 1972.

Let us consider the problem of determining, according to equation (9), wave field $u(t,x,z)$ at a distance z from sensor array $SE_1-SE_n$. A phase function $\phi_z(\omega_1, \omega_2)$ to be approximated by $\rho$ all-pass filters $FF_1-FF_\rho$ ($\rho \leq R$) in the area $AA_1$ of the rotated frequency domain $(\omega_1, \omega_2)$ is:

$$\phi_z(\omega_1, \omega_2) = -z\sqrt{2\omega_1\omega_2} \quad (37)$$

In order to minimize error function $J(a_{i,k})$, it is necessary to connect in cascade filters $FF_1-FF_\rho$ each estimating a change in wave field $u(t,x,z)$ over an incremental variation $\Delta z$ in the distance from sensors $SE_1-SE_n$. Filters $FF_1-FF_\rho$ each have a transfer function $D_{\Delta z}(e^{-j\omega 1}, e^{-j\omega 2})$ which together yield a transfer function $D_z(\exp[-j\omega_1], \exp[-j\omega_2])$ according to the equation:

$$D_z(\exp[-j\omega_1],\exp[-j\omega_2]) = \{D_{\Delta z}(\exp[-j\omega_1],\exp[-j\omega_2])\}^p \quad (38)$$

where function $D_{\Delta z}(\exp[-j\omega_1],\exp[-j\omega_2])$ approximates the phase response:

$$\phi_{\Delta z}(\omega_1,\omega_2) = -\Delta z \sqrt{2\omega_1\omega_2} \quad (39)$$

Taking the limit of the transfer function $D_z(\exp[-j\omega_1],\exp[-j\omega_2])$ as distance increment $\Delta z$ approaches 0 and filter number $p$ increases toward infinity, the product $z = p\Delta z$ remaining constant, we obtain:

$$\begin{aligned}D_z(\exp[-j\omega_1],\exp[-j\omega_2]) &= \\ \lim\{D_{\Delta z}(\exp[-j\omega_1],&\exp[-j\omega_2])\}^p = \\ \Delta z &\longrightarrow 0 \\ p &\longrightarrow \infty \\ p\Delta z = z &= \\ &\exp\left(-jz\sqrt{\frac{\omega_t^2}{c^2} - \omega_x^2}\right)\end{aligned} \quad (40)$$

Thus, approximate operator $D_{\Delta z}$ for the extension of the field through a short or incremental distance $\Delta z$ is derived as a two-dimensional recursive filter.

Table 4 shows the performance index for a fourth-order filter of the phase operator $D_{\Delta z}$ for decreasing values of the distance increment $\Delta z$.

TABLE 4

| $\Delta z = n\Delta$ | $\sum_{r=1}^{R}[(D_{\Delta z})_r - H_r]^2 = J(a_{i,k})$ |
|---|---|
| n | |
| 3 | 40.801232 |
| 2 | 10.386983 |
| 1 | 0.943889 |
| 1/2 | 0.211116 |
| 1/3 | 0.989966E − 01 |
| 1/4 | 0.567464E − 01 |
| 1/5 | 0.370008E − 01 |
| 1/7 | 0.192972E − 01 |
| 1/10 | 0.961479E − 02 |
| 1/1000 | 0.999010E − 06 |

Each term in this table has been determined by using a mask of coefficients $a_{i,k}$ for which the intermediate signal $v(p,q)$ (FIG. 3) is obtained from a multiplicity of previously determined intermediate signals $v(p-1,q-1)$, $v(p-1,q)$, $v(p-1,q+1)$ ... whose space-time-domain points are located in a square with sides parallel to axes $x_1$, $x_2$, as shown in FIG. 1A. In the case of the fourth-order filter, only eight independent coefficients had to be optimized or derived via iteration, owing to the symmetry constraint $a_{i,k} = a_{k,i}$. Phase function $\phi_{\Delta z}(\omega_1,\omega_2)$ was approximated and sum (34) carried out on a polar grid of 100 parameter pairs $(\omega_{1m},\omega_{2m})$ in the first quadrant of the frequency domain $(\omega_1,\omega_2)$ with the limit:

$$(\omega_1^2 + \omega_2^2)^{\frac{1}{2}} \leq \frac{\pi}{2}\sqrt{2}\,\Delta t \quad (41)$$

To determine the wave field $u(t,x,z)$ at a distance $z$ from sensor array $SE_1$-$SE_n$ it is necessary to utilize filters $FF_1$-$FF_p$ which approximate the field in small steps away from the sensor array. However, the squared error $J(a_{i,k})$ of equation (30) increases approximately with the power of $p$; the optimal choice for the elemental step $\Delta z$ must be a compromise between the limit of equation (40) and the allowed maximum number of operations per sample.

Figure 6:
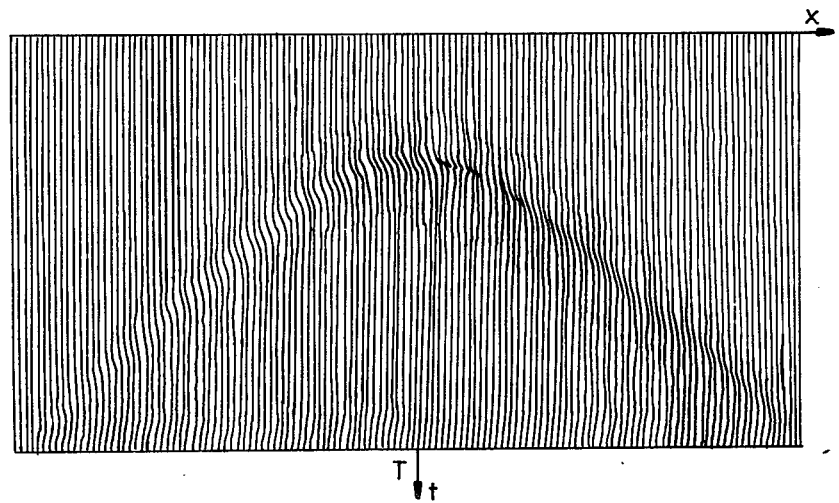
FIG. 6 is a graph showing an input-data pattern for the filter system of FIG. 2.
Figure 7:
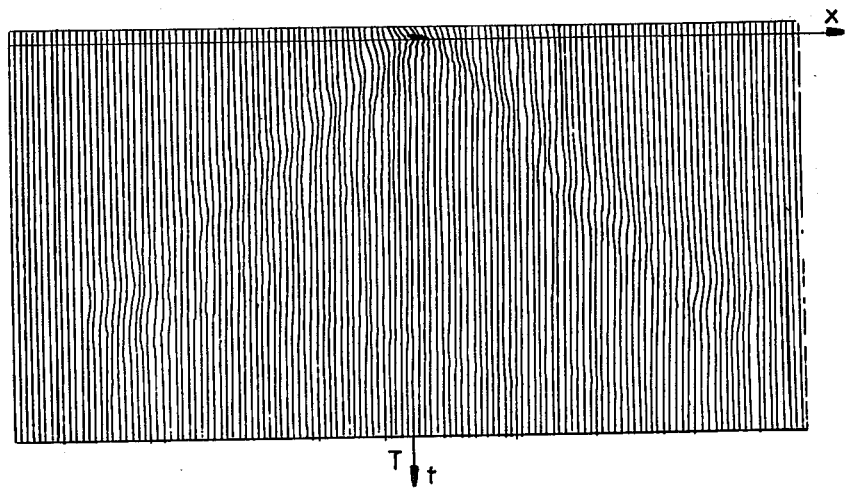
FIG. 7 is an output-data pattern for a series of pulse filters shown in FIG. 2.

A fourth-order digital filter was used to "migrate" the input data or response pattern $u(t,x,0)$ shown in FIG. 6 and recorded at a surface $z=0$ upon the explosion of a source Q at a distance $z=20\Delta z$ from sensor $SE_0$. Such a "migration" would have to produce an increasingly spiked pattern for the sensor $SE_0$. The result of filtering the pattern $u(t,x,0)$ shown in FIG. 6 in the opposite direction along axis t with 20 fourth-order all-pass phase operators or filters $FF_1$-$FF_{20}$ connected in cascade is shown in FIG. 7. This allows the determination of the position of the source Q along array $SE_1$-$SE_n$ and the distance of the source from the array.

I claim:

1. A processing system for determining the location of a shock-wave source in a homogeneous medium, comprising:

a multiplicity of equispaced sensors disposed in a generally linear array for detecting magnitudes of a wave field generated by said source;

sampling means operationally connected to said sensors for extracting pulses therefrom at successive sampling intervals equal to the quotient of the distance between juxtaposed sensors divided by the average wave velocity in said medium;

two-dimensional phase-shifting filter means operationally connected to said sampling means for generating during each sampling interval, from pulses extracted from said sensors, output signals approximating wave-field values at progressively increasing distances from said linear array;

a two-dimensional attenuator operationally connected to said filter means for damping signals having a temporal frequency component less in magnitude than the product of an associated spatial frequency component multiplied by said wave velocity; and a two-dimensional equalizer operationally connected to said attenuator for ensuring a global linear response thereof.

2. A system as defined in claim 1 wherein said filter means includes a plurality of two-dimensional filters for estimating the magnitude of a wave field at a distance from said sensors, said filters being connected in cascade for estimating field values in incremental steps from said sensors.

3. A system as defined in claim 2 wherein said filters are recursive digital filters each implementing the relations:

$$f_r(p,q) = v(p-M,q) + \sum_{i=0}^{M}\sum_{k=0}^{M} a_{i,k}\, v\!\left(p - M + \frac{i+k}{2},\, q - \frac{k-i}{2}\right)$$

$$v(p,q) = f_r(p,q) - \sum_{r-1}\sum_{i=0}^{M}\sum_{k=0}^{M} a_{i,k}\, v\!\left(p - \frac{i+k}{2},\, q - \frac{k-i}{2}\right)$$

wherein functions $$f(p,q) \atop r-1$$

and $f_r(p,q)$ are input and output signals of any one of said filters, time and space coordinates p and q being integers specifying sampling intervals and identifying those of said sensors whose output signals are processed in each sampling interval; upper limit M denotes the order of the respective filter; function v(p,q) is an intermediate product generated by the respective filter in the $p^{th}$ sampling interval for the $q^{th}$ sensor; and real numbers $a_{i,k}$ are multiplication coefficients for the respective filter satisfying the conditions $a_{i,k}=a_{k,i}$, $a_{i,k}=0$ for i+k odd, and $a_{0,0}=0$.

4. A system as defined in claim 1 wherein said attenuator and said equalizer are two-dimensional recursive filters.

5. A system as defined in claim 4 wherein said attenuator includes multipliers and adders interconnected to implement the relations:

$$g'(p,q) = \sum_{i=0}^{N} \sum_{k=0}^{N} b_{i,k} v'\left(p - \frac{i+k}{2}, q - \frac{k-i}{2}\right)$$

$$v'(p,q) = g(p,q) - \sum_{i=0}^{N} \sum_{k=0}^{N} c_{i,k} v'\left(p - \frac{i+k}{2}, q - \frac{k-i}{2}\right)$$

where g(p,q) and g'(p,q) are input and output signals of said attenuator, time and space coordinates p and q being integers specifying consecutive sampling intervals and identifying said sensors, respectively; upper limit N denotes the order of said attenuator; function v'(p,q) is an intermediate processing signal generated by said attenuator in the $p^{th}$ sampling interval for the $q^{th}$ sensor; and real numbers $b_{i,k}$, $c_{i,k}$ are multiplicative coefficients satisfying the conditions $b_{i,k}=b_{k,i}$, $c_{i,k}=c_{k,i}$, $b_{i,k}=c_{i,k}=0$ for i+k odd, and $b_{0,0}=c_{0,0}=0$.

6. A system as defined in claim 1, 2, 3, 4 or 5 wherein said filter means is of order M and includes a read/write memory storing, during each sampling interval and for assignment to a respective sensor, an intermediate signal generated during such sampling interval and M additional intermediate signals generated during M immediately preceding sampling intervals, said memory including positions for storing initial and boundary data utilized in processing signals received during an initial sampling interval and signals assigned to peripherally disposed sensors.

7. A system as defined in claim 6 wherein said filter means further includes summation and multiplication means connected to said read/write memory for receiving therefrom, during each sampling interval, intermediate signals generated during the M preceding sampling intervals and assigned to a respective sensor and intermediate signals generated during the preceding sampling interval and assigned to sensors adjacent said respective sensor.

* * * * *